(12) United States Patent
Rho

(10) Patent No.: US 7,663,399 B2
(45) Date of Patent: Feb. 16, 2010

(54) SEMICONDUCTOR MEMORY DEVICE HAVING OUTPUT DRIVE AND DELAY UNIT

(75) Inventor: Kwang-Myoung Rho, Ichon-shi (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 243 days.

(21) Appl. No.: 11/172,906

(22) Filed: Jul. 5, 2005

(65) Prior Publication Data

US 2006/0091911 A1    May 4, 2006

(30) Foreign Application Priority Data

Nov. 2, 2004    (KR) .................. 10-2004-0088458

(51) Int. Cl.
*H03K 17/16* (2006.01)
*H03K 19/003* (2006.01)
*H03K 19/173* (2006.01)
*H03K 19/094* (2006.01)
*H03K 19/0175* (2006.01)
*H03K 3/00* (2006.01)
*G06F 7/38* (2006.01)
*H03B 1/00* (2006.01)

(52) U.S. Cl. ..................... 326/32; 326/50; 326/83; 327/108

(58) Field of Classification Search .......... 326/83
See application file for complete search history.

(56) References Cited

U.S. PATENT DOCUMENTS 6,118,310 A * 9/2000 Esch, Jr. ................ 327/108

6,362,678 B1 * 3/2002 Bosnyak et al. ........... 327/374
6,756,839 B2 * 6/2004 Hall et al. ................ 327/538
2006/0125520 A1 * 6/2006 Le et al. ................... 326/58

FOREIGN PATENT DOCUMENTS

| JP | 62-176326 | 8/1987 |
| JP | 2-162824 | 6/1990 |
| JP | 11-317653 | 11/1999 |
| KP | 1991-0004735 B1 | 7/1991 |
| KR | 1998-057056 | 9/1998 |
| KR | 10-0255507 B1 | 2/2000 |

OTHER PUBLICATIONS

Korean Patent Gazette issued in Korean Patent Application No. KR 10-2006-0039319, mailed Jan. 17, 2007.

* cited by examiner

*Primary Examiner*—Vibol Tan
*Assistant Examiner*—Matthew C. Tabler
(74) *Attorney, Agent, or Firm*—IP & T Law Firm PLC

(57) ABSTRACT

An output driver for use in a semiconductor memory device includes a pull-up metal oxide semiconductor (MOS) transistor for pulling-up a voltage loaded on an output node in response to a pull-up control signal; a pull-up linear element connected between the pull-up MOS transistor and the output node for increasing a linearity of an output current; a pull-down MOS transistor for pulling-down the voltage loaded on the output node in response to a pull-down control signal; and a pull-down linear element connected between the pull-down MOS transistor and the output node for increasing the linearity of the output current, wherein the pull-up MOS transistor and the pull-up linear element are different typed MOS transistors and the pull-down MOS transistor and the pull-down linear element are different typed MOS transistors.

16 Claims, 6 Drawing Sheets

SEMICONDUCTOR MEMORY DEVICE HAVING OUTPUT DRIVE AND DELAY UNIT

FIELD OF INVENTION

The present invention relates to a semiconductor memory device; and, more particularly, to a semiconductor memory device having a stable pull-up current to pull-down current ratio, regardless of variations of process, voltage and temperature (PVT).

DESCRIPTION OF PRIOR ART

Generally, an output driver for use in a semiconductor memory device has a large driving strength for transferring data to an external load of the semiconductor memory device at a high speed. If the pull-up characteristics of the output driver are different from the pull-down characteristics of the output driver, the wave of an output signal is distorted. Accordingly, a noise margin is reduced and a timing skew is generated. Therefore, it is important that the pull-up characteristics and the pull-down characteristics hold a same value.

FIG. 1 is a schematic circuit diagram showing a conventional output driver.

As shown, the conventional output driver includes a p-type metal oxide semiconductor (PMOS) transistor PM1, a pull-up resistor rs1, an n-type metal oxide semiconductor (NMOS) transistor NM1 and a pull-down resistor rs2.

A source of the PMOS transistor PM1 is coupled to a first power supply voltage VDDQ and a gate of the PMOS transistor PM1 receives a pull-up control signal up_ctr. The pull-up resistor rs1 is connected between a drain of the PMOS transistor PM1 and an output node n1.

A source of the NMOS transistor NM1 is coupled to a second power supply voltage VSSQ and a gate of the NMOS transistor NM1 receives a pull-down control signal dw_ctr. The pull-down resistor rs2 is connected between a drain of the NMOS transistor NM1 and the output node n1.

The conventional output driver pulls down a voltage loaded on the output node n1 by using the NMOS transistor NM1 when the pull-down control signal dw_ctr is activated. On the contrary, when the pull-up control signal up_ctr is activated, the conventional output driver pulls up the voltage loaded on the output node n1 by using the PMOS transistor PM1.

Meanwhile, the pull-up resistor rs1 and the pull-down resistor rs2 are respectively employed for improving linearity of pull-up current and pull-down current of the voltage loaded on the output node n1.

FIG. 2 is a graph showing an output of the conventional output driver and an input/output buffer interface specification (IBIS) of a dynamic random access memory (DRAM).

Herein, X-axis indicates a voltage level of the output node n1. Left Y-axis indicates a current flown on the output node n1 having a unit of milli-ampere (mA). When the current is inputted from the output node n1, a direction of the current is defined as '+'. When the current is outputted from the output node n1, the direction of the current is defined as '−'.

Therefore, a first curve group a' located in a '+' region shows a pull-down current characteristics of the NMOS transistor NM1 according to a variation of process, voltage and temperature (PVT). A second curve group b' located in a '−' region shows a pull-up current characteristics of the PMOS transistor PM1 according to the PVT variation.

Herein, a curve 'a' included in the first curve group a' indicates a DQ pull-down current of an output driver according to the IBIS. A curve 'b' included in the second curve group b' indicates a DOS pull-up current of an output driver according to the IBIS. Accordingly, it is shown that the conventional output driver satisfies the IBIS.

Meanwhile, right Y-axis indicates a pull-up current to pull-down current ratio having a unit of mA/mA. According to the IBIS, the pull-up current to pull-down current ratio ranges from 0.7 mA/mA to 1.40 mA/mA ('C' region). Since the curves included in the 'C' region indicate a pull-up current to pull-down current ratio of the conventional output driver, it is shown that the conventional output driver satisfies the IBIS.

As above-mentioned, in order to satisfy the IBIS of a semiconductor memory device, the PMOS transistor PM1 and the NMOS transistor NM1 are designed to have a same driving strength considering a physical difference such as a majority carrier.

However, although the PMOS transistor PM1 and the NMOS transistor NM1 are designed to have a same driving strength, a driving strength difference between the PMOS transistor PM1 and the NMOS transistor NM1 is increased due to a variation of manufacturing process. Likewise, a variation of temperature or voltage causes the driving strength difference.

Therefore, due to the driving strength difference, the IBIS may not be satisfied and a chip fails to be normally manufactured reducing a yield.

Meanwhile, a delay circuit for use in a semiconductor memory device also has the above-mentioned problem.

FIG. 3 is a schematic circuit diagram showing a conventional delay circuit.

A delay circuit serves to delay an input signal. In order to keep a duty cycle of a periodic input signal, it is important that a propagation delay to logic high output (tPLH) and a propagation delay to logic low output (tPHL) have a same value.

Herein, the tPLH is a delay time required for an output signal to be changed from a logic low level to a logic high level according to a transition of an input signal. Similarly, the tPHL is a delay time required for the output signal to be changed from a logic high level to a logic low level according to a transition of an input signal.

Referring to FIG. 3, the conventional delay circuit includes a PMOS transistor PM2, a pull-up linear resistor rs3, an NMOS transistor NM2, a pull-down linear resistor rs4, a capacitor C1 and an inverter I1.

A source of the PMOS transistor PM2 is coupled to a power supply voltage VDD and a gate of the PMOS transistor PM2 receives an input signal IN. The pull-up linear resistor rs3 is connected between a drain of the PMOS transistor PM2 and an output node n2.

A source of the NMOS transistor NM2 is coupled to a ground voltage VSS and a gate of the NMOS transistor NM2 receives the input signal IN. The pull-down linear resistor rs4 is connected between a drain of the NMOS transistor NM2 and the output node n2.

The capacitor C1 is coupled to the output node n2 for delaying a signal outputted from the output node n2. The inverter I1 inverts the signal outputted from the output node n2 to thereby generate an output signal OUT2.

According to the conventional delay circuit, a driving strength difference between the PMOS transistor PM2 and the NMOS transistor NM2 is increased due to the PVT variation, whereby a difference between the tPLH and the tPHL is also increased. Therefore, the conventional delay circuit may not be normally operated.

Accordingly, a semiconductor memory device adopting the conventional output driver and the conventional delay circuit may not be normally operated due to the above-mentioned problems.

SUMMARY OF INVENTION

It is, therefore, an object of the present invention to provide a semiconductor memory device satisfying an input/output buffer interface specification (IBIS) regardless of a variation of process, voltage and temperature (PVT).

In accordance with an aspect of the present invention, there is provided an output driver for use in a semiconductor memory device, including: a pull-up metal oxide semiconductor (MOS) transistor for pulling-up a voltage loaded on an output node in response to a pull-up control signal; a pull-up linear element connected between the pull-up MOS transistor and the output node for increasing a linearity of an output current; a pull-down MOS transistor for pulling-down the voltage loaded on the output node in response to a pull-down control signal; and a pull-down linear element connected between the pull-down MOS transistor and the output node for increasing the linearity of the output current, wherein the pull-up MOS transistor and the pull-up linear element are different typed MOS transistors and the pull-down MOS transistor and the pull-down linear element are different typed MOS transistors.

In accordance with another aspect of the present invention, there is provided a delay circuit for use in a semiconductor memory device, including: a pull-up metal oxide semiconductor (MOS) transistor for pulling-up a voltage loaded on an output node in response to an input signal; a pull-up linear element connected between the pull-up MOS transistor and the output node for increasing a linearity of a current; a pull-down MOS transistor for pulling-down the voltage loaded on the output node in response to the input signal; a pull-down linear element connected between the pull-down MOS transistor and the output node for increasing the linearity of the current; a capacitor coupled to the output node for delaying an output of the output node; and an inverter coupled to the output node for synchronizing a phase of the input signal with a phase of an output of the inverter, wherein the pull-up MOS transistor and the pull-up linear element are different typed MOS transistors and the pull-down MOS transistor and the pull-down linear element are different typed MOS transistors.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor device in accordance with the present invention will be described in detail referring to the accompanying drawings.

Figure 4:
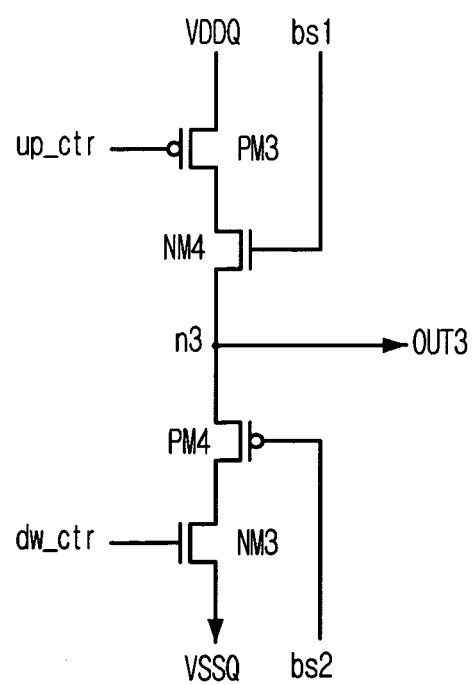
FIG. 4 is a schematic circuit diagram showing an output driver for use in a semiconductor memory device in accordance with a preferred embodiment of the present invention.

FIG. 4 is a schematic circuit diagram showing an output driver for use in a semiconductor memory device in accordance with a preferred embodiment of the present invention.

As shown, the output driver includes a pull-up metal oxide semiconductor (MOS) transistor PM3 for pulling up a voltage loaded on an output node n3 in response to a pull-up control signal up_ctr; a pull-up linear element NM4 connected between the pull-up MOS transistor PM3 and the output node n3 for increasing a linearity of an output current; a pull-down MOS transistor NM3 for pulling down the voltage loaded on the output node n3 in response to a pull-down control signal dw_ctr; and a pull-down linear element PM4 connected between the pull-down MOS transistor NM4 and the output node n3 for increasing the linearity of the output current. Herein, the pull-up linear element NM4 and the pull-up MOS transistor PM3 are different typed MOS transistors. Likewise, the pull-down linear element PM4 and the pull-down MOS transistor NM3 are different typed MOS transistors.

In detail, the pull-up MOS transistor PM3 is a p-type metal oxide semiconductor (PMOS) transistor. A gate of the pull-up MOS transistor PM3 receives the pull-up control signal up_ctr and a source of the pull-up MOS transistor PM3 is coupled to a first power supply voltage VDDQ. The pull-up linear element NM4 is an n-type metal oxide semiconductor (NMOS) transistor. A gate of the pull-up linear element NM4 receives a first bias voltage bs1 and a source of the pull-up linear element NM4 is coupled to the output node n3.

The pull-down MOS transistor NM3 is an NMOS transistor. A source of the pull-down MOS transistor NM3 is coupled to a second power supply voltage VSSQ and a gate of the pull-down MOS transistor NM3 receives the pull-down control signal dw_ctr. The pull-down linear element PM4 is a PMOS transistor. A gate of the pull-down linear element PM4 receives a second bias voltage bs2 and a source of the pull-down linear element PM4 is coupled to the output node n3.

Herein, the first bias voltage bs1 has a voltage level so that the pull-up linear element NM4 is operated in a linear region. Likewise, the second bias voltage bs2 has a voltage level so that the pull-down linear element PM4 is operated in a linear region.

In comparison with the conventional output driver, the pull-up linear element NM4, which is one type of a MOS transistor different from the pull-up MOS transistor PM3, replaces the pull-up resistor rs1. Likewise, the pull-down linear element PM4, which is the other type of a MOS transistor different from the pull-down MOS transistor NM3, replaces the pull-down resistor rs2. Therefore, regardless of the PVT variation, a pull-up current to pull-down current ratio can hold a constant value.

Since a pull-up/pull-down valid resistance is determined by a total resistance of a resistance of one type of a MOS transistor, e.g., PM3, and a resistance of the other type of a MOS transistor, e.g., NM4, the pull-up current to pull-down current ratio holds a constant value.

That is, for example, when a driving strength of an NMOS transistor is increased and a driving strength of a PMOS transistor is decreased due to the PVT variation, although a driving strength of the pull-down MOS transistor NM3 is increased, a pull-down current variation is prevented since a resistance of the pull-down linear element PM4 is increased.

Figure 1:
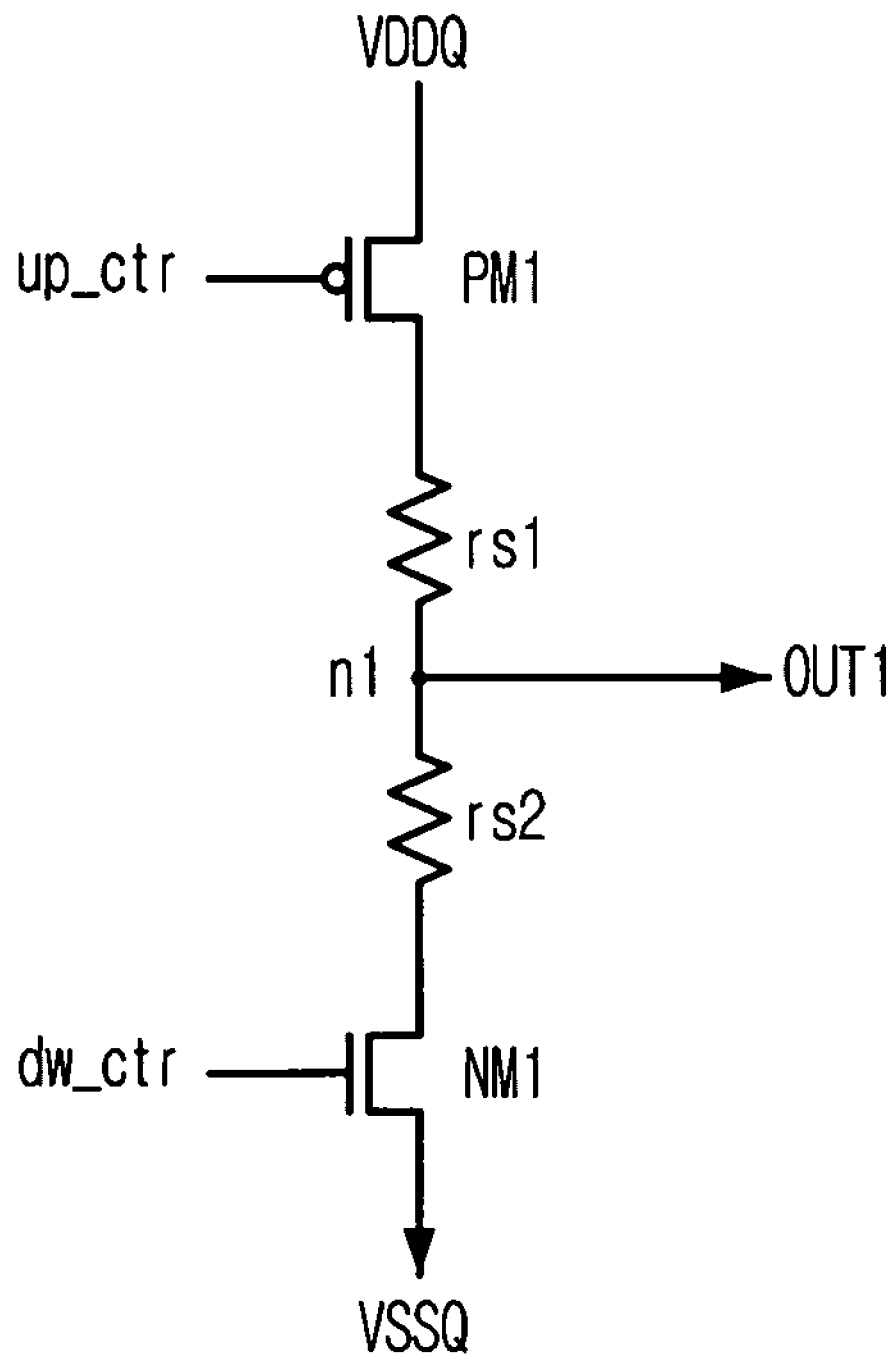
FIG. 1 is a schematic circuit diagram showing a conventional output driver.
Figure 2:
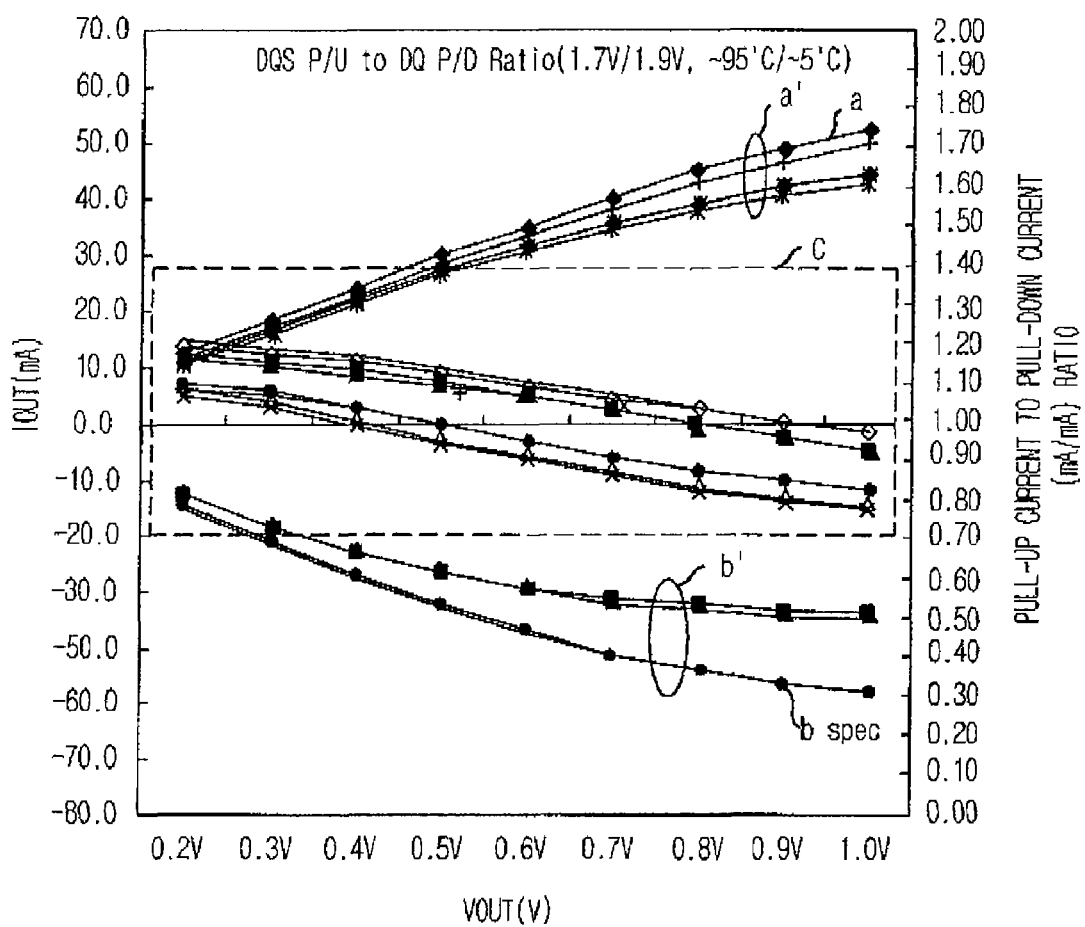
FIG. 2 is a graph showing an output of the conventional output driver shown in FIG. 1 and an input/output buffer interface specification (IBIS) of a dynamic random access memory (DRAM)
Figure 5:
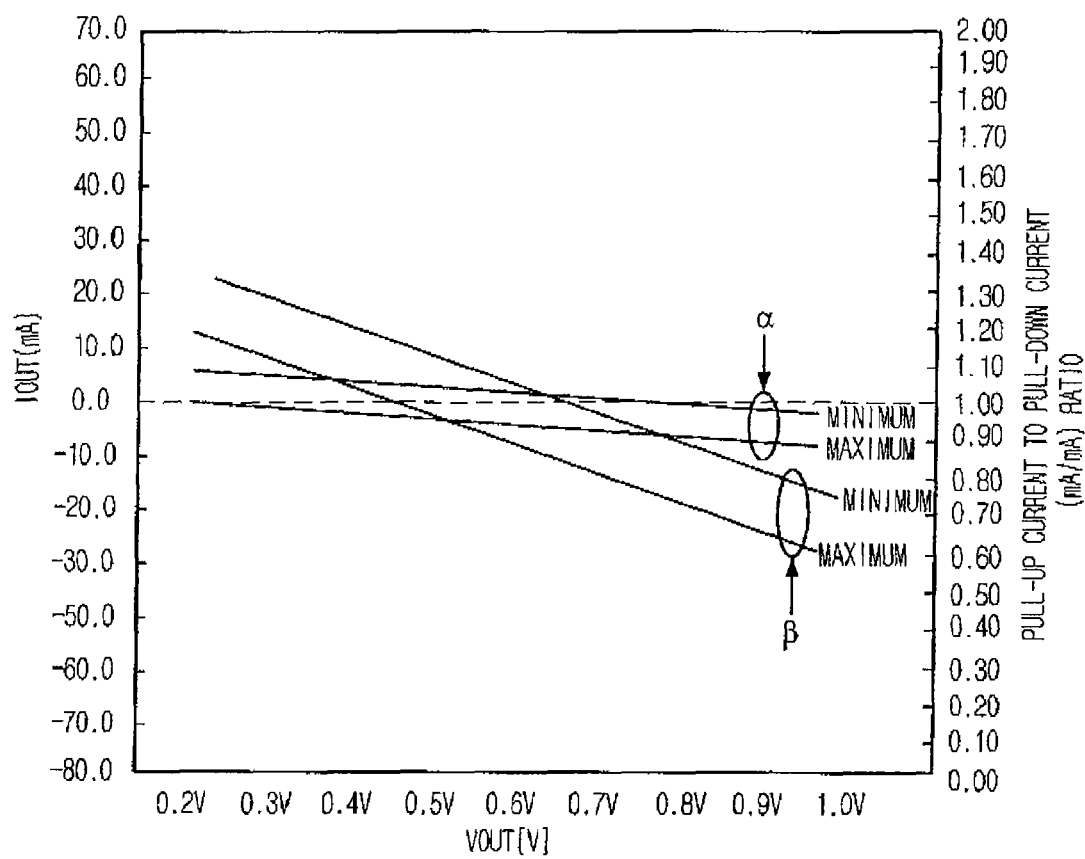
FIG. 5 is a graph showing a pull-up current to pull-down current ratio of the conventional output driver shown in FIG. 1 and a pull-up current to pull-down current ratio of the output driver shown in FIG. 4.

FIG. 5 is a graph showing a pull-up current to pull-down current ratio of the conventional output driver shown in FIG. 1 and a pull-up current to pull-down current ratio of the output driver shown in FIG. 4.

Herein, X-axis indicates a voltage level of an output driver having a unit of voltage (V) and Y-axis indicates the pull-up current to pull-down current ratio having a unit of mA/mA.

The '$\alpha$' shown in FIG. 5 indicates the pull-up current to pull-down current ratio of the output driver according to the present invention. The '$\beta$' shown in FIG. 5 indicates the pull-up current to pull-down current ratio of the conventional output driver. Each of the '$\alpha$' and the '$\beta$' includes two lines indicating a maximum value and a minimum value of the pull-up current to pull-down current ratio according to a variation of process, voltage and temperature (PVT).

Therefore, according to the prior art, the pull-up current to pull-down current ratio is always located between two lines included in the '$\beta$'. Likewise, in accordance with the present invention, the pull-up current to pull-down current ratio is always located between two lines included in the '$\alpha$'.

Meanwhile, referring to FIG. 5, it is shown that the pull-up current to pull-down current ratio of the conventional output driver is more rapidly changed in comparison with the pull-up current to pull-down current ratio of the output driver of the present invention. That is, the pull-up current to pull-down current ratio of the present invention is less changed according to a voltage variation.

It is also shown that a difference between the maximum value and the minimum value of the pull-up current to pull-down current ratio of the present invention is smaller than that of the prior art. That is, the pull-up current to pull-down current ratio of the present invention is less changed according to the PVT variation in comparison with the pull-up current to pull-down current ratio of the prior art.

Therefore, in accordance with the present invention, although each characteristics of a PMOS transistor and an NMOS transistor is changed due to the PVT variation, the pull-up current to pull-down current ratio holds a constant value since each of a pull-up path and a pull-down path includes different-typed MOS transistors.

Figure 6:
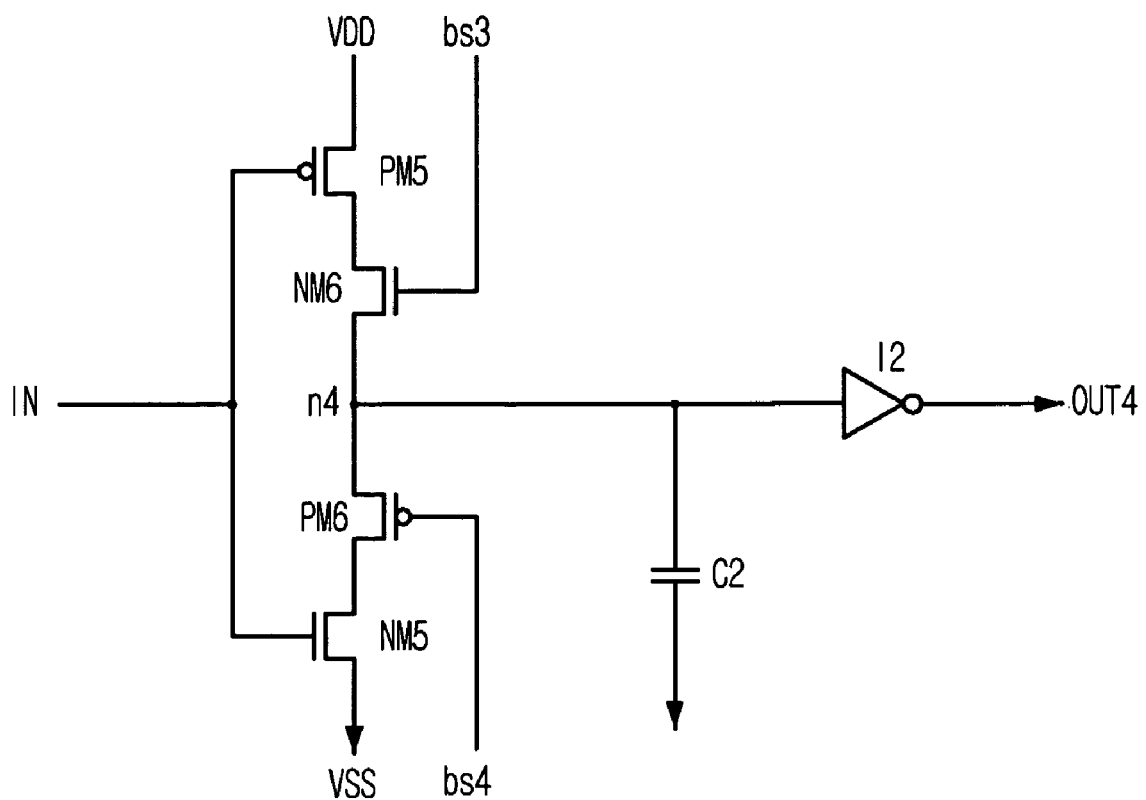
FIG. 6 is a schematic circuit diagram showing a delay circuit for use in a semiconductor memory device in accordance with another preferred embodiment of the present invention.

FIG. 6 is a schematic circuit diagram showing a delay circuit for use in a semiconductor memory device in accordance with another preferred embodiment of the present invention.

As shown, the delay circuit includes a pull-up MOS transistor PM5 for pulling up a voltage loaded on an output node n4 in response to an input signal IN; a pull-up linear element NM6 connected between the pull-up MOS transistor PM5 and the output node n4 for increasing a linearity of an output current; a pull-down MOS transistor NM5 for pulling down the voltage loaded on the output node n4 in response to the input signal IN; a pull-down linear element PM6 connected between the pull-down MOS transistor NM5 and the output node n4 for increasing the linearity of the output current; a capacitor C2 coupled to the output node n4 for delaying a signal outputted from the output node n4; and an inverter 12 for inverting the signal outputted from the output node n4 to thereby synchronize a phase of the input signal IN with a phase of an output signal OUT4. Herein, the pull-up linear element NM6 and the pull-up MOS transistor PM5 are different typed MOS transistors. Likewise, the pull-down linear element PM6 and the pull-down MOS transistor NM5 are different typed MOS transistors.

In detail, the pull-up MOS transistor PM5 is a PMOS transistor. A gate of the pull-up MOS transistor PM5 receives the input signal IN and a source of the pull-up MOS transistor PM5 is coupled to a first power supply voltage VDD. The pull-up linear element NM6 is an NMOS transistor. A gate of the pull-up linear element NM6 receives a first bias voltage bs3 and a source of the pull-up linear element NM6 is coupled to the output node n4.

The pull-down MOS transistor NM5 is an NMOS transistor. A source of the pull-down MOS transistor NM5 is coupled to a second power supply voltage VSS and a gate of the pull-down MOS transistor NM5 receives the input signal IN. The pull-down linear element PM6 is a PMOS transistor. A gate of the pull-down linear element PM6 receives a second bias voltage bs4 and a source of the pull-down linear element PM6 is coupled to the output node n4.

As above-mentioned, each of a pull-up path and a pull-down path includes different typed MOS transistors, i.e., each of the pull-up path and the pull-down path includes a PMOS transistor and an NMOS transistor. Therefore, regardless of the PVT variation, a propagation delay to logic high output (tPLH) and a propagation delay to logic low output (tPHL) hold a same value.

Figure 3:
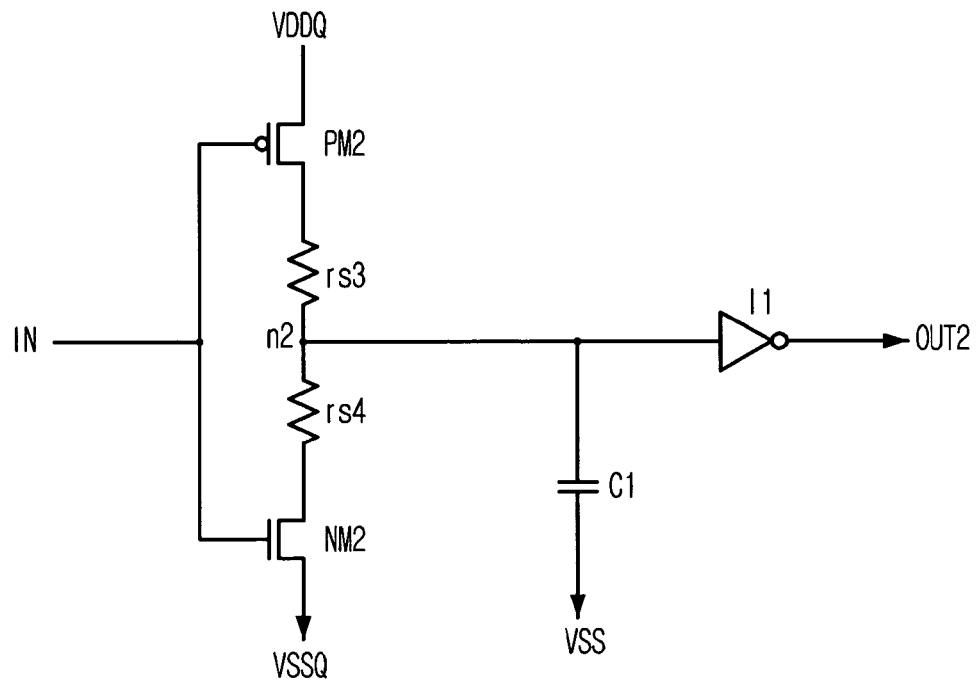
FIG. 3 is a schematic circuit diagram showing a conventional delay circuit.
Figure 7A:
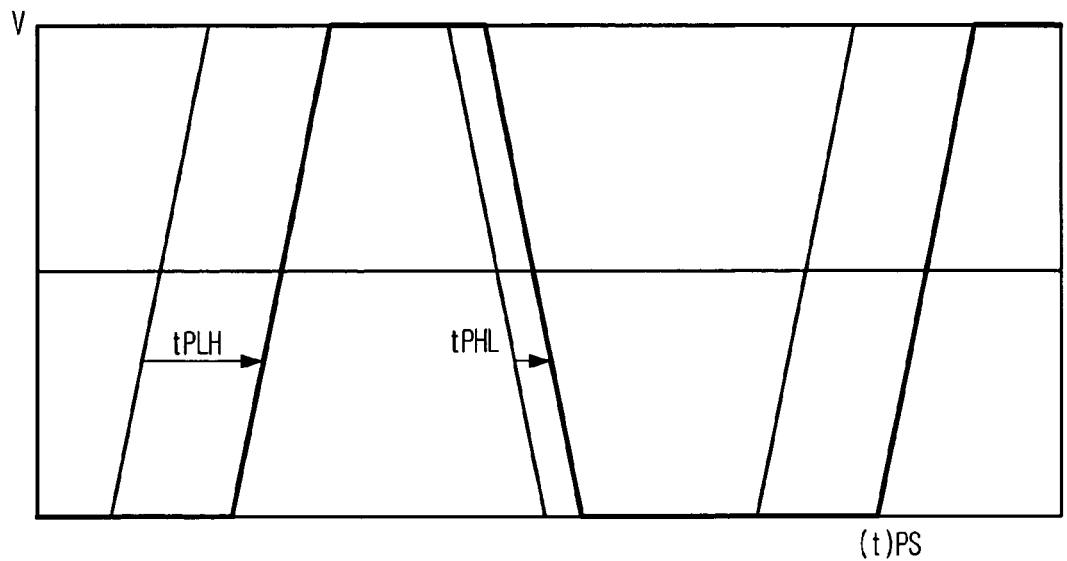
FIG. 7A is a graph showing a propagation delay to logic high output (tPLH) and a propagation delay to logic low output (tPHL) of the conventional delay circuit shown in FIG. 3.
Figure 7B:
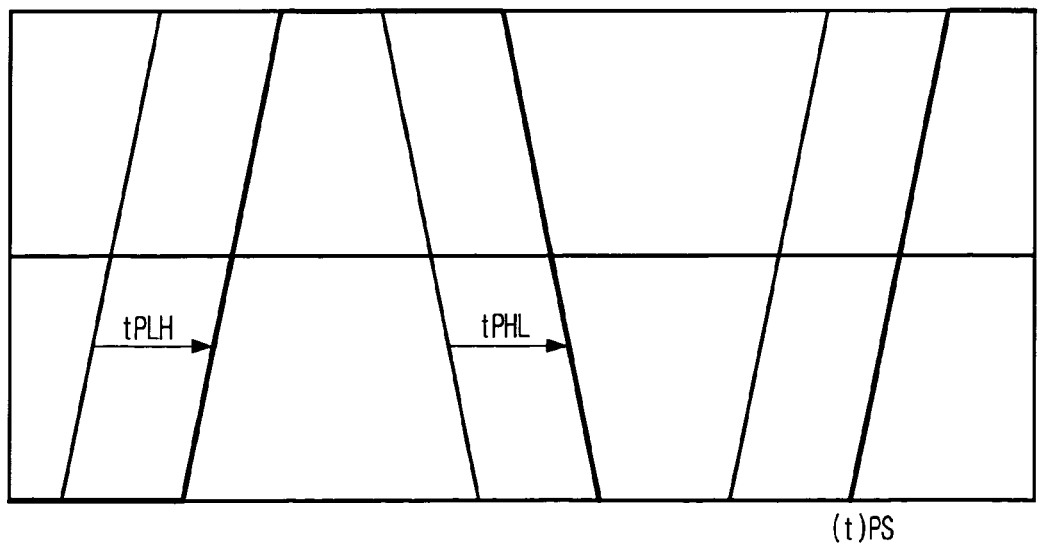
FIG. 7B is a graph showing the tPLH and the tPHL of the delay circuit shown in FIG. 6.

FIG. 7A is a graph showing the tPLH and the tPHL of the conventional delay circuit shown in FIG. 3. FIG. 7B is a graph showing the tPLH and the tPHL of the delay circuit shown in FIG. 6.

Herein, X-axis indicates time having a unit of pico-second (ps). Y-axis indicates a voltage (V). An input signal is drawn by a thin line and an output signal is drawn by a thick line.

Referring to FIG. 7A, according to the conventional delay circuit, there is a great difference between a value of the tPLH and a value of the tPHL. However, referring to FIG. 7B, the tPLH and the tPHL of the delay circuit shown in FIG. 6 hold a same value.

Therefore, in accordance with the present invention, the pull-up current to pull-down current ratio of an output driver or a delay circuit holds a constant value regardless of the PVT variation. Accordingly, a semiconductor memory device employing an output driver and a delay circuit in accordance with the present invention can be stably operated. A yield of the semiconductor memory device can be increased.

The present application contains subject matter related to Korean patent application No. 2004-88458, filed in the Korean Patent Office on Nov. 2, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An output driver for use in a semiconductor memory device, comprising:
    a pull-up metal oxide semiconductor (MOS) transistor having a first type for pulling-up a voltage loaded on an output node in response to a pull-up control signal;
    a pull-up linear element having a second type transistor connected between the pull-up MOS transistor and the output node for increasing a linearity of an output current in response to a first bias signal;
    a pull-down transistor having the second type for pulling-down the voltage loaded on the output node in response to a pull-down control signal; and a pull-down linear element having the first type transistor connected between the pull-down transistor and the output node for increasing the linearity of the output current in response to a second bias signal, wherein a pull-up valid resistance is determined by the pull-up MOS transistor and the pull-up linear element having different typed transistors and a pull-down valid resistance is determined by the pull-down transistor and the pull-down linear element having different typed transistors to allow a pull-up current to pull-down current ratio to have a constant value by using contrary characteristics of the different typed transistors according to process, voltage and temperature (PVT) variation, and wherein the pull-up linear element and the pull-down linear element are respectively controlled.

2. The output driver as recited in claim 1, wherein each of the pull-up MOS transistor and the pull-down linear element is a p-type metal oxide semiconductor (PMOS) transistor and each of the pull-down transistor and the pull-up linear element is an n-type metal oxide semiconductor (NMOS) transistor.

3. The output driver as recited in claim 2, wherein a gate of the pull-up MOS transistor receives the pull-up control signal and a source of the pull-up MOS transistor is coupled to a first power supply voltage.

4. The output driver as recited in claim 3, wherein a gate of the pull-up linear element receives a first bias voltage and a drain and a source of the pull-up linear element are respectively connected to the drain of the pull-up MOS transistor and the output node.

5. The output driver as recited in claim 4, wherein a gate of the pull-down transistor receives the pull-down control signal and a source of the pull-down transistor is coupled to a second power supply voltage.

6. The output driver as recited in claim 5, wherein a gate of the pull-down linear element receives a second bias voltage and a source and a drain of the pull-down linear element are respectively connected to a drain of the pull-down transistor and the output node.

7. The output driver as recited in claim 6, wherein the first bias voltage is a voltage for the pull-up linear element being operated in a linear region.

8. The output driver as recited in claim 7, wherein the second bias voltage is a voltage for the pull-down linear element being operated in a linear region.

9. A delay circuit for use in a semiconductor memory device, comprising:
a pull-up metal oxide semiconductor (MOS) transistor having a first type for pulling-up a voltage loaded on an output node in response to an input signal;
a pull-up linear element having a second type transistor connected between the pull-up MOS transistor and the output node for increasing a linearity of a current in response to a first bias signal;
a pull-down transistor having the second type for pulling-down the voltage loaded on the output node in response to the input signal;
a pull-down linear element having the first type transistor connected between the pull-down transistor and the output node for increasing the linearity of the current in response to a second bias signal;
a capacitor coupled to the output node for delaying an output of the output node; and
an inverter coupled to the output node for synchronizing a phase of the input signal with a phase of an output of the inverter, wherein a pull-up valid resistance is determined by the pull-up MOS transistor and the pull-up linear element having different typed transistors and a pull-down valid resistance is determined by the pull-down transistor and the pull-down linear element having different typed transistors to allow a pull-up current to pull-down current ratio to have a constant value by using contrary characteristics of the different typed transistors according to process, voltage and temperature (PVT) variation, and wherein the pull-up linear element and the pull-down linear element are respectively controlled.

10. The delay circuit as recited in claim 9, wherein each of the pull-up MOS transistor and the pull-down linear element is a p-type metal oxide semiconductor (PMOS) transistor and each of the pull-down transistor and the pull-up linear element is an n-type metal oxide semiconductor (NMOS) transistor.

11. The delay circuit as recited in claim 10, wherein a gate of the pull-up MOS transistor receives the input signal and a source of the pull-up transistor is coupled to a first power supply voltage.

12. The delay circuit as recited in claim 11, wherein a gate of the pull-up linear element receives a first bias voltage and a drain and a source of the pull-up linear element are respectively connected to the drain of the pull-up MOS transistor and the output node.

13. The delay circuit as recited in claim 12, wherein a gate of the pull-down transistor receives the input signal and a source of the pull-down transistor is coupled to a second power supply voltage.

14. The delay circuit as recited in claim 13, wherein a gate of the pull-down linear element receives a second bias voltage and a source and a drain of the pull-down linear element are respectively connected to a drain of the pull-down transistor and the output node.

15. The delay circuit as recited in claim 14, wherein the first bias voltage is a voltage for the pull-up linear element being operated in a linear region.

16. The delay circuit as recited in claim 15, wherein the second bias voltage is a voltage for the pull-down linear element being operated in a linear region.

* * * * *